United States Patent [19]

Fauchier et al.

[11] 4,188,617
[45] Feb. 12, 1980

[54] SYSTEM FOR CONVERTING ANALOG SIGNALS TO MULTIPLEXED DIGITAL DATA

[75] Inventors: Jess F. Fauchier; William H. Seipp, both of Bettendorf; Stephen E. Whiteside, Davenport, all of Iowa

[73] Assignee: Gulf & Western Industries, Inc., New York, N.Y.

[21] Appl. No.: 916,287

[22] Filed: Jun. 16, 1978

Related U.S. Application Data

[63] Continuation of Ser. No. 727,792, Sep. 29, 1976, abandoned.

[51] Int. Cl.² .......................................... G08C 15/06
[52] U.S. Cl. .................................. 340/183; 364/900;
179/15 R
[58] Field of Search .......... 340/347 M, 347 AD, 183, 340/147 C, 150; 364/900; 179/15 R

[56] References Cited

U.S. PATENT DOCUMENTS

| | | | |
|---|---|---|---|
| 3,493,731 | 2/1970 | Lemonde | 340/347 M |
| 3,653,037 | 3/1972 | Utley | 340/347 M |
| 3,806,916 | 4/1974 | Diaz et al. | 340/347 M |
| 3,940,759 | 2/1976 | Zitelli et al. | 340/347 M |

OTHER PUBLICATIONS

The Engineering Staff of Analog Devices, Inc., Analog-Digital Conversion Handbook, 1972, pp. I-1 to I-7; I-41 to I-53; I-59 to I-61; I-106 to I-19; I-20 to I-37; II-48 to II-50; II-156 to II-163; III-1 to III-9; III-43 to III-45; III-50 to III-61.

Hnatek, A User's Handbook of D/A and A/D Converters, J. Wiley & Sons, 6/76, pp. 395-401.

*Primary Examiner*—Thomas J. Sloyan
*Attorney, Agent, or Firm*—Meyer, Tilberry & Body

[57] ABSTRACT

A system for providing digital data representative of a selected analog signal on the data lines of a programmable controller using a central processing unit. The system employs a conversion circuit which converts the input analog signal to digital data on output data terminals upon receipt of a conversion signal simultaneously with an analog signal and which creates a completion signal when the conversion is completed. The system can use at least two analog inputs that receive at least two analog conditions and convert a selected one of the analog conditions to an analog signal. Upon actuation of one of the input modules, the selected analog signal of the selected module is directed to the conversion circuit. After conversion, the conversion completion signal of a conversion circuit then deactivates the actuated input module for the next conversion cycle.

4 Claims, 11 Drawing Figures

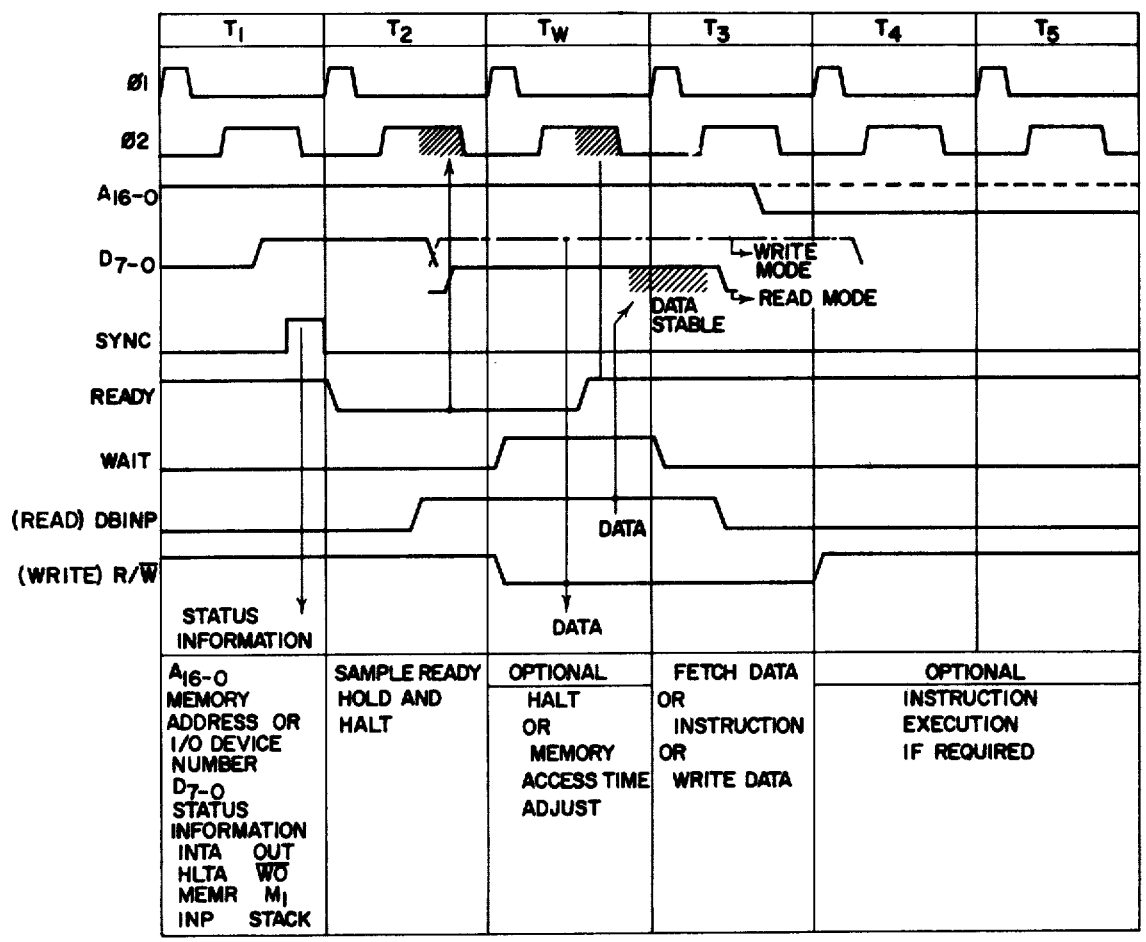

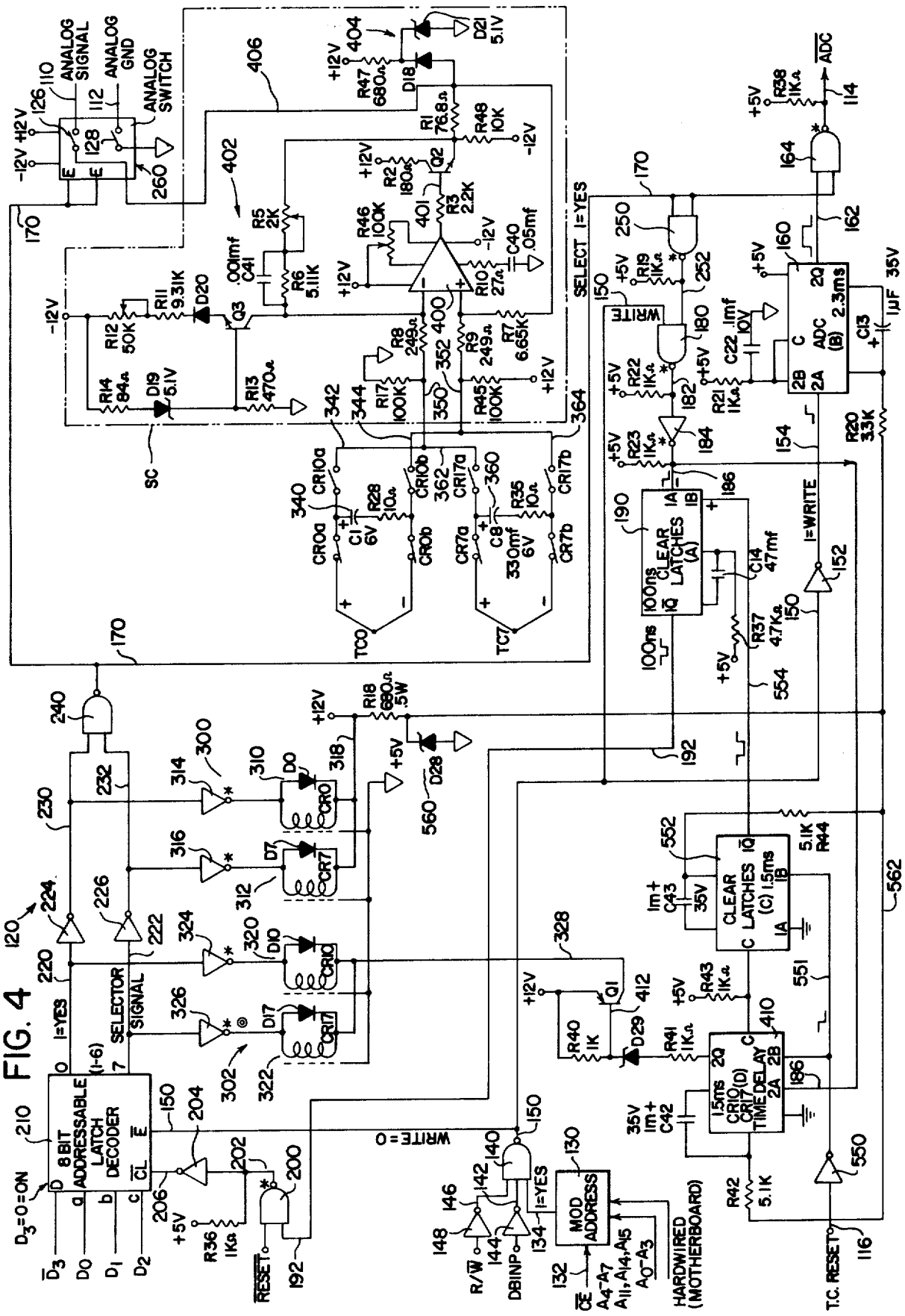

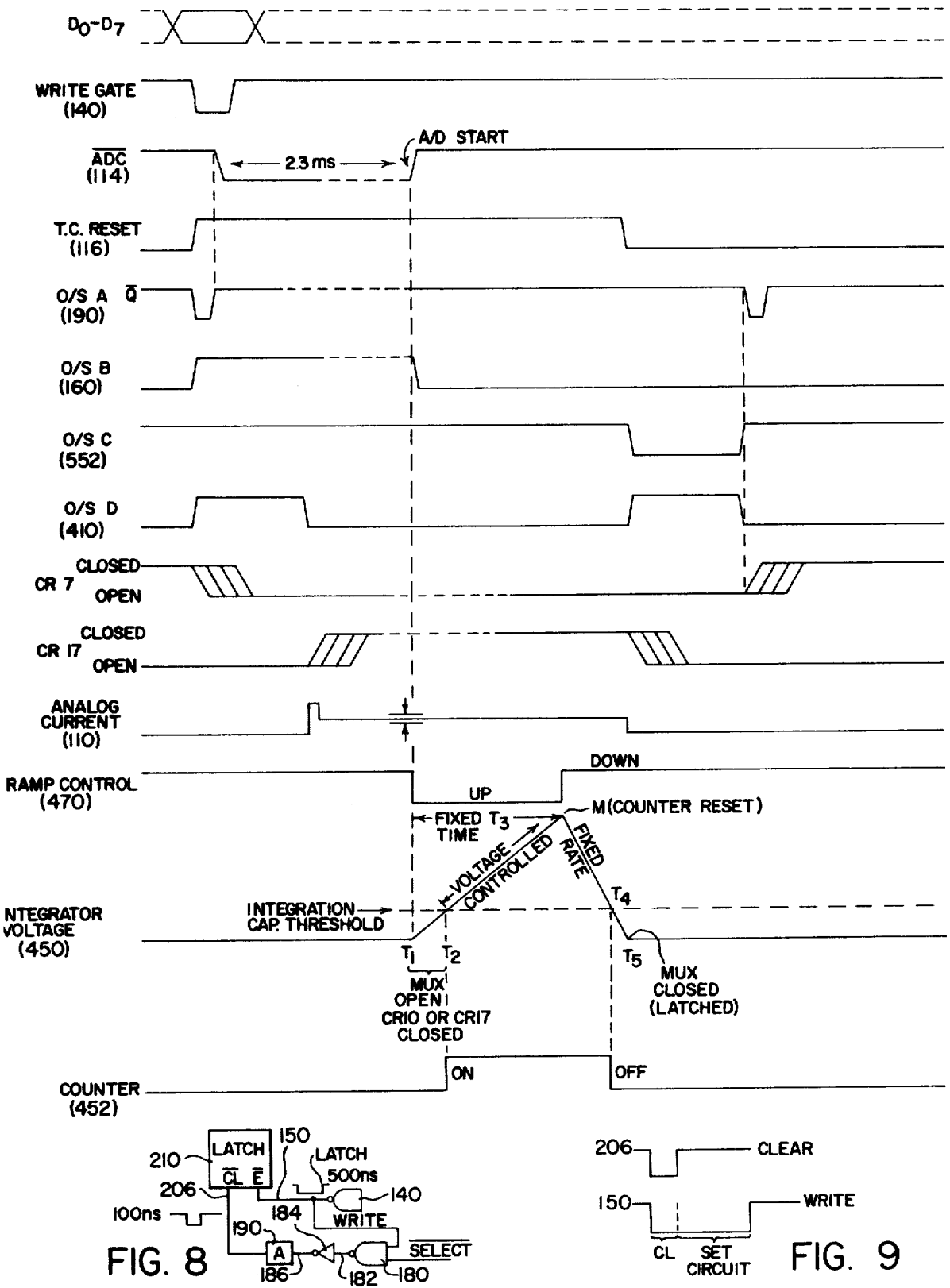

SYSTEM FOR CONVERTING ANALOG SIGNALS TO MULTIPLEXED DIGITAL DATA

This is a continuation of application Ser. No. 727,792 filed Sept. 29, 1976.

The present invention relates to the art of programmable controllers of the type using a microprocessor for a central processing unit and more particularly to a system for converting analog signals to digital data in such a programmable controller.

The invention is particularly applicable for converting analog input conditions, such as temperature controlled voltages, to digital data for the data lines of a microprocessor programmable controller, and it will be described with particular reference thereto; however, this invention has somewhat broader applications and may be used for converting various analog signals to digital data for use on the data lines of various programmable controllers.

INCORPORATION BY REFERENCE

Prior application Ser. No. 701,858, filed July 1, 1976, is incorporated by reference herein as illustrating a programmable controller system for which the present invention is particularly adapted.

BACKGROUND OF INVENTION

In recent years, there has been developed a series of microprocessors of the type used to process digital data in a manner similar to digital computers. These microprocessors are integrated circuit chips which generally include a series of output address lines, four or eight bi-directional data lines, and a series of command lines, such as READ, WRITE, WAIT, READY, HOLD and synchronization. With the advent of this type of miniaturized device, digital processing of information for a variety of applications has become possible and relatively inexpensive. Most development work has been directed toward the concept of utilizing the relatively limited terminals of a microprocessor to process the digital data in a series of machine cycles divided into a series of micro cycles. In accordance with the application incorporated by reference herein, a microprocessor has been incorporated into a programmable controller in a manner that recognizes the limitations of the microprocessor and provides substantial external hardwire modules to employ the limited functional characteristics of the microprocessor in a total system having the capabilities of inputting and outputting either bit or byte digital data. Consequently, the programmable controller using a microprocessor can control various machines, processes, and other sequential manipulations. This type of system, to be universal in nature, requires the use of a conversion circuit for converting input analog signals into digital information available on the data lines of the microprocessor forming the central part or central processing unit of the programmable controller. Various circuits are known for converting analog to digital information. These circuits include a device for inputting an analog voltage and converting the magnitude of the voltage into digital data on output terminals to be used by data lines of the system, such as a digital computer. These available converting devices usually employ a multiple bit output data representative of the magnitude of the input analog signal. Generally, the digital data is the output of a binary counter having several stages, such as twelve. Thus, a full scale conversion of an input voltage signal by such a converting circuit requires ten output terminals to read between 0 and 999. This would give a full scale conversion of the input signal between 0% and 99.9%. One additional terminal is generally used to show that the counter has started to count. Consequently, eleven or twelve output data terminals are employed at the output of an analog conversion circuit of the general nature used in converting analog input voltage signals into output digital full scale readings. Such a conversion circuit is well adapted for digital computers having a greater number of data lines; however, when using a programmable controller employing a microprocessor, there are insufficient data lines for accepting full scale digital output data for the input analog signal. Thus, if ten output terminals are required for a full scale reading, a microprocessor having only four data terminals can not accept the digital information in its output form from a standard type of conversion circuit. The same is true of the higher capacity microprocessor having eight data lines. For that reason, efforts have been made to provide a standard conversion circuit for use in a microprocessor having a limited number of data lines.

In systems to be controlled by programmable controller, it is often necessary to input a large number of analog signals, such as thermocouple voltages, speed analog signals and position analog signals. Consequently, any analog system for general purpose use with a programmable controller must have an analog input circuit for accepting a large number of analog signals and converting them to digital data for use on the bidirectional data lines of the microprocessor. This has presented a substantial amount of difficulty in adapting a microprocessor for use in a programmable controller system. As a first proposal for accomplishing this feat, it was suggested that the number of digital converting circuits be increased as the input analog signal increased. This substantially added to the size and cost of a programmable controller, the advantage of which is the reduction in size and a low capital investment. Thus, such an expansion arrangement was counterproductive to the basic concept of using a microprocessor in a programmable controller. The present invention relates to an analog system for inputting analog signals into a programmable controller using a microprocessor, with its inherent limitations, which system allows a large number of input analog signals to be processed using only a single analog to digital conversion circuit.

STATEMENT OF INVENTION

In accordance with the present invention, there is provided a system for providing digital data representative of a selected analog signal on the data lines of a programmable controller using a processing unit having output address lines, a selected number of input/output bi-directional data lines, means for creating a WRITE signal in a WRITE line and means responsive to the WRITE signal for writing data from the data lines into selected addressed locations. The system comprises a conversion circuit for converting an input analog signal to digital data on output data terminals upon receipt of a conversion signal simultaneously with an analog signal and means for creating a completion signal when the conversion is completed. The system also comprises an analog input module including means for receiving at least two analog conditions, means for converting a selected one of the analog conditions to an analog signal, selecting means for selecting one condition upon creation of the WRITE signal, directing means for directing the selected analog signal to the conversion circuit and means for latching the selected means until creation of the completion signal.

By using this concept, a number of input modules can be incorporated and multiplexed into a single conversion circuit so that a great number of input analog signals can be processed in a programmable controller using this invention and controlled by a central processing unit of the microprocessor type.

In accordance with another aspect of the invention, there is provided a system of the general type described above, which system employs a data latch for latching a signal select logic code upon receipt of a latch enabling signal. Also, this latch is cleared upon receipt of a clear signal. In accordance with one aspect of the invention, the enabling signal is created by the WRITE signal of the microprocessor and the clear signal is created at the initial stage of the enabling signal. Consequently, a single program software command from the microprocessor to the analog input module clears the analog input module of any prior selected analog signal, allows data on the data lines of the microprocessor to settle on the input side of the data latch and then latches the incoming data, in decoded form, onto the output terminals of the data latch. This coded data selects one of several analog input signals controlled by a single analog input module. In this manner, a single command to the programmable controller can be used to clear the latch and then set the latch to the desired current analog signal to be processed.

Other aspects of the present invention will be appreciated from a detailed description of the preferred embodiment of the invention.

In accordance with the primary object of the present invention there is provided a system for creating digital data representative of a selected analog signal on the data lines of a programmable controller using a central processing unit, generally of the type employing a microprocessor, which system can selectively process a large number of input analog signals to create representative digital data on a single set of data terminals.

Still a further object of the present invention is the provision of a system as described above, which system requires only a single analog to digital conversion circuit.

Yet another object of the present invention is the provision of a system as set forth above, which system can employ readily available analog to digital conversion concepts.

Still a further object of the present invention is the provision of a system as defined above, which system can be used on a variety of microprocessors and other digital processing equipment without substantial modification of the equipment.

Still a further object of the present invention is the provision of a system as defined above, which system employs a reduced number of commands to process input analog signals, is generally universal in its use on digital equipment and can be incorporated in a single module connectable with existing digital processing equipment.

Still a further object of the present invention is the provision of a system as defined above, which system employs an analog current signal at the analog to digital conversion circuit to reduce the effect of circuit parameters on the available analog signal at the conversion circuit.

Another object of the present invention is the provision of a system as defined above, which system processes digital data having a greater number of bits than the data lines of the programmable controllers.

These and other objects and advantages will become apparent from the following description taken together with the accompanying drawings.

BRIEF DESCRIPTION OF DRAWINGS

In the drawings of this disclosure:

FIG. 2 is a status chart for a standard 8080 Intel microprocessor of the type using the system illustrated in FIG. 1;

FIG. 3 is a standard pulse chart illustrating logic on various lines of an Intel 8080 microprocessor of the type contemplated for use in the system illustrated in FIG. 1;

FIG. 4 is a wiring diagram illustrating the preferred embodiment of the present invention for creating a selected analog output signal;

FIG. 5 is a pulse and voltage chart illustrating certain pulses and voltages employed in the preferred embodiment of the invention, as shown in FIG. 4, and some voltages created in the circuit shown in FIGS. 6A, 6B and 6C;

FIG. 8 is a simplified logic diagram illustrating how certain pulses in the preferred embodiment of the invention shown in FIG. 4 control the input data latch of this embodiment; and, FIG. 9 is a pulse chart illustrating the clear and enable or write pulse controlling the logic in FIG. 8 and corresponding logic in the preferred embodiment of the invention, as shown in FIG. 4.

GENERAL CONTROLLER SYSTEM

Figure 1:
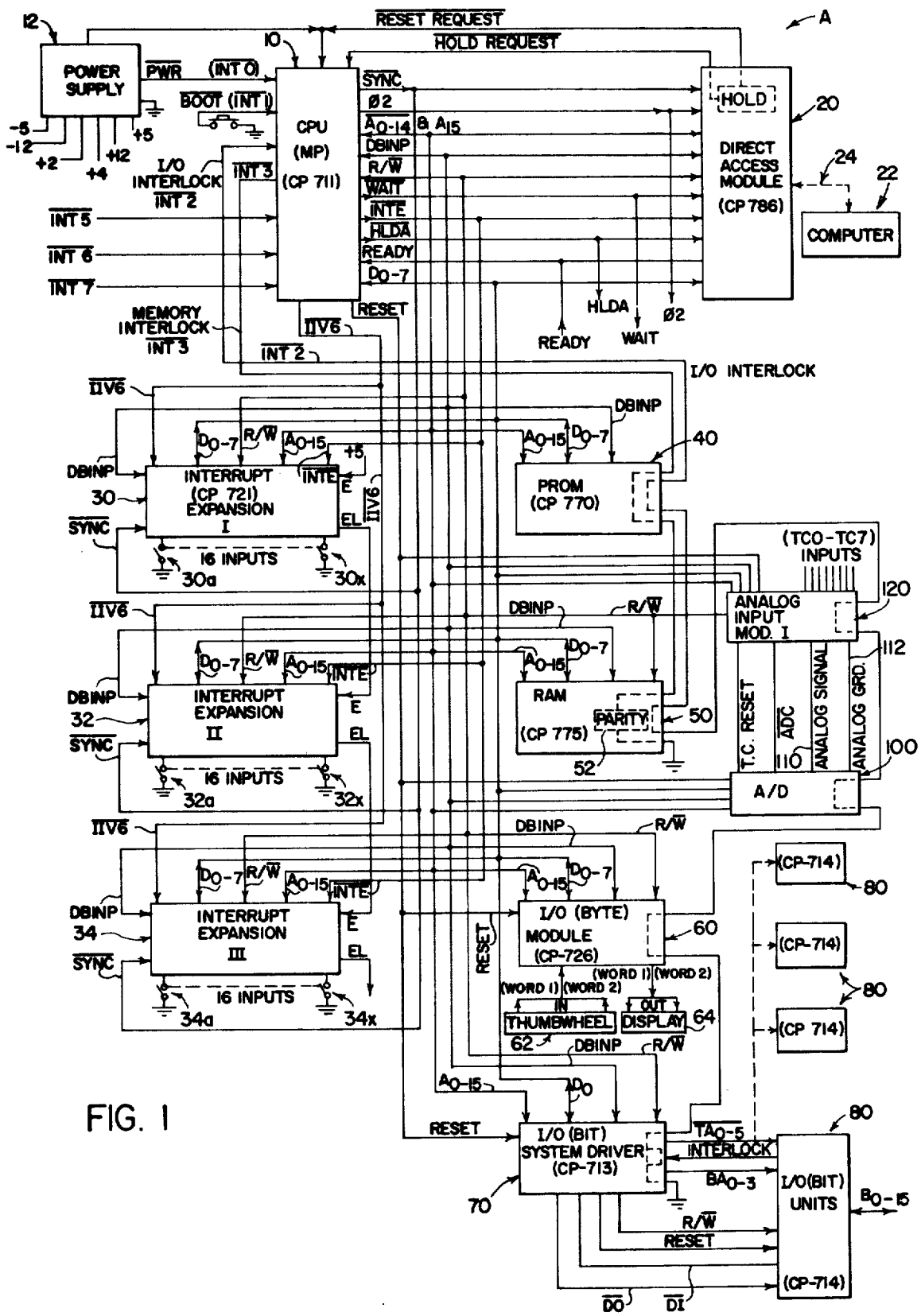
FIG. 1 is a schematic wiring diagram illustrating a programmable controller employing a microprocessor as a central processing unit of the type to which the present invention is particularly directed and illustrating, schematically, a manner in which the preferred embodiment of the present invention is incorporated into the programmable controller.

Referring now to FIGS. 1, 2 and 3 wherein the showings are for the purpose of illustrating a programmable controller A for controlling machines, processes and other systems in response to input information from inputs and existing conditions or other parameters. This controller system uses the module and method of the present invention. The inputs, conditions and parameters are directed to the controller A from various external terminals and locations which are capable of providing binary information as single bit or multiple bits, i.e. bytes. These external terminals may be switches, decoded thumbwheels, lights, decoded analog data and binary coded conditions. In accordance with normal practice the controller includes memory locations and is processed in accordance with a program stored as a plurality of steps or instructions in such system memory. Certain random access memories are provided for storing intermediate information or data. This memory can also be used for some program storage although a program read only memory is generally used for storage of the program information or steps.

As illustrated in FIG. 1, programmable controller A is a digital processing system including a plurality of separate and distinct plug-in modules interconnected by a plurality of control lines, which are generally in a motherboard connecting system, except for remote input/output modules. The basic modules and control lines therefore are schematically illustrated in FIG. 1 wherein a central processing unit module (CPU) 10 or module CP711 employs a standard microprocessor as its central control unit. This microprocessor is a known MOS integrated circuit chip which includes internal registers, counters, pointers and associated logic circuitry well known in the art. The microprocessor, has a number of output address terminals, a number of bi-directional data terminals, means for setting the chip into various known states and means for providing a status code on the data lines at the start of each separate command. Although a variety of microprocessors having these standard capabilities could be used, the embodiment illustrated in FIGS. 1, 2 and 3 involves the use of an Intel 8080 microprocessor which has sixteen address terminals and eight bi-directional data terminals. The controller A incorporates the various concepts relating to the use of a microprocessor for processing input and output information to control a preprogrammed series of events of a machine, process, etc. The input information in the illustrated embodiment is digital information both at the input and output; however, converters for conversion between analog and digital could be used to interface between the system shown in FIG. 1 and various analog inputs and/or outputs. The CPU module 10 is communicated with the other modules to process input and output information on lines $D_0$–$D_7$. A brief description of the separate modules will be sufficient to illustrate their intended use with the CPU module 10 and the overall operation of programmable controller A.

To initially program and debug the controller A, there is provided a direct access module 20 which takes over control of several control lines connected to CPU module 10. Thus, it is possible to directly program the memories in controller or system A by an external device, such as a schematically represented digital computer 22. In the illustrated embodiment, the computer is connected to direct access module 20 by schematically represented lines 24. When a HOLD REQUEST signal is directed from module 20 to CPU module 10, computer 22, or other external control devices, obtains control over the address lines, the input designation line DBINP, the READ/WRITE line, and the $D_0$–$D_7$ data lines, and other lines shown by the arrows in FIG. 1. When this happens, the CPU module is essentially disconnected from the rest of the controller and computer 22 can load memories, i.e. to program the controller, and actually operate the controller, as in debugging and troubleshooting. The direct access module is used to load all memories of system A with the desired logic, set inputs and outputs to the desired conditions, selectively read the contents of the memory or the various input and output circuits, reset controller A, provide intermediate stop and run operations for the controller A, and check the status of all the memory positions and registers of controller A including the registers of the microprocessor MP in CPU module 10. The direct access module is used for flow of data to and from system A under the control of an external unit such as a computer, external tape reading devices, teletype, etc.

In order to accomplish transfer of control to module 20, microprocessor MP of module 10 is placed into the HOLD state, which will be explained later. The external programmer, such as a computer or tape reader, sends data to and from controller A through data lines $D_0$–$D_7$ and the location of the data is controlled by address lines $A_0$–$A_{15}$. By placing the microprocessor of module 10 in the HOLD condition or state, instead of the HALT state, the functions of the microprocessor can be taken over by a programmed signal or request from module 20. Also, control by the microprocessor can be reestablished by a simple command without complex programming required when the microprocessor shifts to a HALT state. It is not necessary to provide an initiation pulse for again obtaining control over system A by module 10. As soon as the HOLD condition is released, the CPU module 10 again assumes control over the lines illustrated in FIG. 1. This provides a convenient manner for giving direct access to the controller A for programming and debugging and then for releasing the controller for control, which is isolated from module 20.

CPU module 10 may be interrupted by external conditions to interrupt the program and shift control over the microprocessor to a memory stored subroutine. This is a standard INTERRUPT feature of most eight bit microprocessors; however, controller A includes a plurality of separate interrupt expansion modules, three of which are schematically illustrated as interrupt expansion modules I, II, III, or 30, 32 and 34, respectively. The difference between the first expansion module and subsequent expansion modules is that the enabled terminal E of module 30 is tied to a logic 1, which in practice is five volts throughout controller or system A. The subsequent modules 32, 34, and any additional modules, include an input enable logic at terminal E which is controlled by the condition of preceding interrupt expansion modules. This connection arrangement provides a priority level system wherein the interrupt inputs of module 30 have a priority over the interrupt inputs of subsequent interconnected expansion modules 32, 34, etc. In each of the interrupt expansion modules, in the illustrated embodiment, there are provided sixteen separate interrupt inputs which are schematically illustrated as a plurality of single pole, grounded switches 30a–30x, 32a–32x and 34a–34x. These interrupt inputs can be logic inputs which contain information requesting a shift of module 10 into the interrupt state for processing of a selected subroutine. Thus, actuation of an input will cause the microprocessor MP of module 10 to interrupt and shift into the subroutine which is to be processed. Then control is returned to the executive program of controller or system A. By using this interrupt expansion arrangement, a great number of selectable subroutines can be provided and called by providing an interrupt request at one of the several schematically represented logic inputs. The executive program of system A requires the processing of a "look" command or sequence for those data or logic inputs and outputs under interrupt control only when an interrupt request is received indicating that a certain terminal or terminals should be scanned and/or updated.

When an interrupt request is received by the CPU module from a terminal of an expansion module, the microprocessor shifts to an interrupt state and data from the expansion module selects or "calls" a given subroutine by an address on lines $D_0$–$D_7$. Then the calling input or output will be processed according to the desired and requested interrupt subroutine. Thereafter the subroutine will shift command back to the main program. If there is no interrupt request, then the executive program is processed repeatedly without processing the interrupt subroutines. Consequently, the subroutines are called and processed only when needed. The number of expansion terminals of modules 30–34 can be increased to larger values. The only practical limitations are the memory capacity which can be expanded to various capacities and the time available for processing interrupt subroutines.

By providing the interrupt expansion modules, the microprocessor of system or controller A can be interrupted a substantially greater number of times than is available on known microprocessors. Thus, the normal microprocessor interrupt concept of priority evaluation and jumping to a subroutine called by a particular interrupt can be used for many separate inputs or conditions. This saves programming time and allows the use of subroutines which may be stored into the memories of system A for only periodic use. The versatility of system A is thereby greatly expanded while still using a readily available, relatively inexpensive microprocessor.

Module 40 is a programmable read only memory (PROM) module. This PROM module is used in system A for the purpose of retaining permanent logic at various addressed locations determined by the logic on lines $A_0$–$A_{15}$. In practice, the executive program and the various subroutines are generally, permanently stored at various addressed locations within PROM module 40. This memory module is used for long term or permanent storage of the program and employs MOS memory chips that are erasable upon exposure to ultraviolet light and are programmable by means, such as computer 22 or a tape reading device through direct access module 20. In practice, the PROM module has a capacity of 4,096 eight bit words. The number of words available in the read only memory module 40 may vary according to the desired capacity of system A. In practice, the memory technology used in module 40 is static silicon gate MOS erasable and electrically reprogrammable read only memory chips.

During normal operation of controller A, data is directed from module 40 on lines $D_0$–$D_7$. The parallel transmission of binary data on these lines provides an eight bit word which is addressed by the logic on lines $A_0$–$A_{15}$. In FIG. 1, it is indicated that the data lines $D_0$–$D_7$ are bi-directional at PROM module 40. This is only for the purposes of loading the memory during the programming and debugging operation through direct access module 20. The memory chips of module 40, in practice, are not erasable under normal circumstances; therefore, continuous application of power to this particular module is not required for the purpose of retaining the stored logic. Of course, a variety of different types of read only memories could be used for storing the program information for system A, as schematically illustrated in FIG. 1.

Referring now more particularly to the random access memory (RAM) module 50, this memory module can be updated periodically during use of system or controller A. Various random access memory modules could be used in system A. The random access memory module 50 includes a somewhat standard parity checking circuit 52 schematically illustrated in FIG. 1. In this manner, information to and from the random access memory chips will be checked for parity in accordance with standard practice to determine an error. In practice, module 50 employs random access solid state memory chips with a capacity of 4,096 eight bit words. In this module, an external battery supply is used for retaining the information or data at the several locations on module 50, until the information or data is changed intentionally by operation of controller A. The semiconductor memory technology used in module 50 is static N-MOS random access technology. The module 50 is addressable for both reading and writing by the logic on lines $A_0$–$A_{15}$, which address selects the desired address of the RAM module and directs the eight bit word from that location in parallel onto data lines $D_0$–$D_7$. The DBINP logic and the R/W logic determines whether or not the data is being inserted or read from module 50. Operation of a random access memory in conjunction with a microprocessor or other type of digital programmable controller is known and various systems could be employed.

In addition to the PROM module 40 and the RAM module 50, it is possible to provide additional memory which may be in the form of PROM and/or RAM. The parity circuit 52, in practice, is of the type which provides a nine bit word and circuitry necessary to generate and check one bit of odd parity for each word. When an eight bit word is written into the memory, parity generator tests the word and generates a nine bit which will be either a logic 1 or a logic 0 such that the resulting nine bit word will always contain an odd number of logic 1 conditions. When a word is read from the memory, parity check circuitry checks to be certain that the word still contains an odd number of logic 1 signals. If the check circuit encounters an even number of logic 1 signals, the processor is interrupted in accordance with standard microprocessor practice. Other parity checking circuits or systems could be employed so that errors in the accessed information can be detected.

Programmable controller A employs a standard microprocessor which has eight data terminals and sixteen address terminals. In this manner, an eight bit word or byte can be serviced simultaneously by the microprocessor. This capacity provides distinct advantages with respect to a reading of several inputs and writing into several outputs. However, the logic processing of a single bit in an eight bit word such as ANDing, ORing, or INVERTing, presents substantial difficulty. A substantial amount of software programming is required to logic process a single bit of an eight bit word or byte. This requires memory space and extensive programming. This disadvantage is even more serious in controlling machines and process because a great number of simple logic functions are required. In duplicating a standard relay logic diagram or ladder diagram much of the processing is logic processing of single bit information. Thus, to process this single bit information with an eight bit data capacity drastically increases program storage space and control complexity. For instance, when a single input is to be compared with a single output, the use of eight bit input information is a disadvantage. When memory addresses or binary coded data is being transferred or processed, then the large number of data lines is beneficial. To overcome logic processing disadvantages caused by increasing the capacity of the microprocessor, controller system A provides circuitry for obtaining one bit information which can be logic processed on a preselected data line, such as line $D_0$, in a manner similar to a single bit data processor. Thus, it is a relatively simple process to AND, OR and IN-VERT logic at various inputs and outputs to provide logic functions which are rendered more complex with the advent of the expanded eight bit microprocessor. To illustrate the use of both the byte and bit modes of operation, there is illustrated a byte input and output module 60 and a bit input and output module 70. Module 60 has a series of input words each of which has eight data bits. These words are created by various inputs, such as thumbwheel network 62. In a like manner, the output words from module 60 are illustrated as display signals in a display unit 64. Thus, module 60 is used to input and output a byte of information as an eight bit word into various input or output locations.

A single bit of information is inputted or outputted from the system driver or module 70 on a single data line $D_0$. Thus, when a bit mode of operation is selected by circuitry, constructed in accordance with the present invention, the logic of line $D_0$ only is processed. The logic on the other bidirectional data lines is ignored. To determine whether or not there is a single bit of information directed to the output units 80 through system driver 70, the system driver is controlled by the logic on the input line DBINP and the READ/$\overline{\text{WRITE}}$ line R/$\overline{\text{W}}$. A power supply 12 provides five volts D.C. for operation of the logic in system A and twelve volts D.C. for the operation of certain other components. The 2 volt and 4 volt lines from the power supply 12 are used for retaining the logic of the RAM when power is inadvertently interrupted. These two lines are controlled by rechargeable batteries. Of course, a variety of other power supplies could be provided in accordance with the desired power requirements of programmable controller A.

CONTROL LINE DEFINITIONS

Referring again to FIG. 1, a number of control lines are illustrated as communicating between CPU module 10 and the various other modules comprising the programmable controller system A. These control lines are external of the CPU module; however, in many instances they correspond to or are logically associated with certain communicating terminals on the 8080 Intel microprocessor used in the illustrated embodiment of a programmable controller using the present invention. To appreciate the general operation of programmable controller system A, the basic function of each of the lines illustrated in FIG. 1 will be described separately. Throughout the specification the inverted form of a line designation indicates that a low logic condition, whether pulse or continuous, is the true or "yes" condition. For instance, the READ/$\overline{\text{WRITE}}$ line labeled R/$\overline{\text{W}}$ indicates that the read condition is a logic 1 and the write condition is a logic 0. This convention is used in most equipment employing microprocessors and similar digitally controlled numerical processing devices.

The synchronizing signal line $\overline{\text{SYNC}}$ consists of a 100 ns negative or low logic pulse indicating the beginning of each 8080 machine cycle. This pulse is not programmable and is used to latch the status word in each component or module which requires status information from the CPU for use during a total machine cycle which may contain one or more words.

The external clock pulse $\phi 2$ is created by the CPU internal clocking generator and can be used to synchronize the operation of the various modules. The signal may also be used as an accurate time base. In practice, this clock has either a 2.0 MHz or a 3.0 MHz frequency.

The address lines $A_0$-$A_{15}$ are all logic 0 true, except for $A_{15}$. The logic on these lines is used to provide the address to all memories and I/O modules for controller system A. These address lines are generally output lines from module 10; however, when using the direct access module 20, they are bi-directional and allow input of addresses to module 10. $A_0$ is the least significant address bit in the addressing lines.

The DBINP line indicates the direction of communication of the data lines $D_0$-$D_7$. This control line is used to gate data onto the data bus lines from each of the modules of system A.

The R/$\overline{\text{W}}$ line is used in system A to gate data on the data buses to the addressed locations. In view of the similarity between the DBINP line and the R/$\overline{\text{W}}$ line, they are generally used together. The DBINP line is used to determine the direction of data flow and to gate the data onto the data buses. The READ/$\overline{\text{WRITE}}$ line R/$\overline{\text{W}}$ is used to determine whether this data is written or read. By providing these two control lines, the data on the data bus or lines $D_0$-$D_7$ is stable during the reading and writing pulse on the R/$\overline{\text{W}}$ line.

The WAIT line is used in connection with the READY line. These lines are communicated with the microprocessor, which allows an additional amount of time for reading slower memory or I/O (input/output) locations. If during an addressed output, the module 10 does not receive a logic 1 condition on the READY line, the microprocessor will enter a WAIT state as long as the READY line is at a low logic. In this state, a logic 0 is created on the $\overline{\text{WAIT}}$ line. As soon as the READY input is received, the microprocessor passes out of the WAIT state and a logic 1 appears on the $\overline{\text{WAIT}}$ line. This feature is clearly illustrated in FIG. 2 which relates to the operation of the 8080 Intel microprocessor.

The INTE output indicates the content of an internal interrupt enable flip-flop on the 8080 microprocessor chip. This internal flip-flop may be set or reset by enable and disable interrupt instructions and inhibits subsequent interrupt calls from being accepted by the microprocessor when the flip-flop is in the reset condition. The internal flip-flop which is produced on the chip itself is automatically reset to disable further interrupts at the time $T_1$ of an Instruction Fetch cycle $M_1$ and when an interrupt has been accepted by the microprocessor.

The $\overline{\text{HLDA}}$ line is the Hold Acknowledge line. This line shifts to a logic 0 when a HOLD REQUEST is acknowledged by the microprocessor MP. This HOLD REQUEST is from the line HOLD REQUEST, as shown in FIG. 1. The HOLD condition or stage of the microprocessor shifts the address and data terminals of the microprocessor to a high impedance state so that these terminals release control over the address lines $A_0$-$A_{15}$ and the data lines $D_0$-$D_7$. These lines can be controlled by the access module 20 during programming and debugging. The signal on the $\overline{\text{HLDA}}$ line begins at time $T_3$ for a read memory or input cycle. For a write in memory or an output cycle or operation, the $\overline{\text{HLDA}}$ line is shifted at the clock period following the $T_3$ clocking period. In practice, it is known that the signal on the $\overline{\text{HLDA}}$ line appears after a rising edge of $\phi 1$ of the high impedance on the address lines and data lines occurs after the following edge of φ2. The HOLD REQUEST line indicates that there has been an external request to shift the CPU, and more particularly the microprocessing chip, into the HOLD condition or state. In this HOLD condition or state, external devices can control the address and data lines as soon as the CPU module has completed its use of these lines for processing the existing or current machine cycle. Control is also relinquished by the CPU module over the DBINP line and the R/W line. In other words, these lines may be controlled by the direct access module 20 for programming or other external control functions. In summary, when a HOLD state is requested, the microprocessor shifts into the HOLD condition or state and gives an output signal on the $\overline{HLDA}$ line to indicate this HOLD condition. This condition occurs after a certain amount of clean-up during a machine cycle being processed. The HOLD condition or state comes into being at the next machine cycle and holds the existing internal logic on register conditions of the microprocessor chip.

A similar arrangement is used for the reset operation. A Reset Request is created by the power supply 12 or by the direct access module 20 on the RESET REQUEST line. When this request is received by module 10, the microprocessor is reset. In this condition, the content of the internal program counter of the 8080 microprocessor is cleared. After the reset pulse, the program will start at a location word zero in the memory. The internal INTE and HLDA flip-flops of the microprocessor chip are also reset. The internal accumulator, stack pointer, and registers are not cleared. When the reset condition is entered, the logic on the RESET line is shifted to reset the various flip-flops and other logics throughout system A. This arrangement is used for starting controller system A into operation.

The bi-directional data buses or lines $D_0$–$D_7$ provide eight bit data communication to and from CPU module 10. In addition, these lines are communicated with the various memory modules and I/O modules. The modules which perform only bit functions, as opposed to byte functions, utilize only one of these lines, at least for outputting data. In the preferred embodiment, this line is $D_0$. During the first clock cycle of each machine cycle of the microprocessor, the CPU module outputs a status word on the data line or bus $D_0$–$D_7$. This status word is an eight bit word which describes the current machine cycle. In this status word, the $D_0$ line, in the preferred embodiment, is the least significant bit. The present invention relates to a microprocessor of the type utilizing eight bits of data; however, a different number of data bits can be employed without departing from the intended scope of the invention. With an eight data bit microprocessor the status word can have eight bits generated by the microprocessor according to the instruction or command received from the program.

In microprocessors now available, there is an INTERRUPT capability which is briefly described above. An INTERRUPT capability of the microprocessor allows it to store its present position in a program, jump to a called subroutine, process the subroutine and then jump back to the proper location in the program that was being previously processed. To perform this function, the microprocessor has an INT input and module 10 has several interrupt request terminals INT 0-INT 7. Logic on the INT terminal shifts the microprocessor into the interrupt state. At that time, the INTE terminal ($\overline{INTE}$ line) is energized to prevent subsequent interrupts, until the selected subroutine has reset the INTE terminal at the proper time. A higher priority interrupt can take over operation of the controller before a lower level priority interrupt subroutine is completed, if the INTE has been reset by the processed subroutine. In the past, processing systems utilizing the microprocessor have involved the capability of receiving only a finite, relatively limited number of interrupt requests. This limitation has been dictated by the limitations of the various codes available for subroutine selection or "call". System A employs a system which includes eight interrupt inputs which will shift the microprocessor into the interrupt state. In FIG. 1, interrupts INT 0-INT 3 and INT 5-INT 7 are illustrated. In practice, these interrupts are assigned to external conditions, terminals or parameters, which may be inputs or outputs. The priority of the interrupt requests is in reverse order to the numbering, with the highest priority having the lowest number. The lowest priority has the highest number; therefore, the $\overline{PWR}$ condition, which is a logic 0 when power has been turned off, is the highest priority interrupt. In this condition, irrespective of other interrupt conditions, the program will shift into the "power off" subroutine which is found at a selected position in memory, which in practice is octal 010. In practice, the next interrupt input is the $\overline{BOOT}$ which creates interrupt request INT 2 to a location in memory. In this manner, a minimum program is available for initial operation of system A. This initial minimum program is located at octal 020 of memory and is "called" by various means schematically represented as a pushbutton in FIG. 1. Interrupt request INT 3 is the module interlock and parity check condition, which is operated in accordance with known practice to maintain continuity of the various modules. The INT 4 interrupt request is a real clock interrupt request, which shifts the program to the octal 040 position in memory. This will be described in more detail with respect to the interrupt functions of system A. INT 5 is a communication interrupt, in the preferred embodiment of the invention. This interrupt generates a location octal 050 in memory. This allows communication from external means, such as the direct access module 20. The interrupt INT 7, which has the lowest priority, places the microprocessor into the interrupt state to read or write from external devices, such as thumbwheels, lights, switches and visual display devices. This leaves INT 6, which is used with modules 30, 32 and 35 to expand the amount of interrupt capability in system A. The IIV6 output acknowledges the receipt and processing of an INT 6 interrupt request. This signal line remains at a low logic while the interrupting device transmits a call from one of the modules 30–34 to the CPU module 10. The call instruction is transmitted synchronously with a φ2 clock signal and provides the address in memory to which a call is placed during a selected additional interrupt provided by the add-on modules, only three of which are shown.

This description of the basic lines or command paths directed to and from CPU module 10 will be sufficient for a full appreciation of the invention which contemplates an improved module used with a microprocessor programmable controller of the type schematically shown in FIG. 1. These outputs and input lines correspond in nomenclature used by Intel Corporation for its 8080 microprocessor chip used in the preferred embodiment of the present invention. Corresponding nomenclature is used in other commercially available microprocessor chips which have the characteristics set forth generally herein as background and explanatory information well known in the field. The characteristics of this microprocessor chip are well known. Module 10 could produce an I-STROBE control line for software production of a strobe to the various inputs and outputs, if desired.

STATUS WORD FOR MICROPROCESSOR

In the microprocessor utilized in module 10, as in most microprocessors, a status word appears on the data terminals at the first of each machine cycle. This status word indicates the operation to be performed by the microprocessor during the current machine cycle. Although a variety of status codes and conditions could be provided, the ten status words of the Intel 8080 microprocessor are illustrated in the chart shown in FIG. 2. The data terminals have the coding indicated in the vertical columns for each of the various types of machine cycles during the initial part of the cycle. The binary status code on terminals $D_0$–$D_7$ is latched into a status latch at the initial synchronization pulse in the $\overline{SYNC}$ line.

When the machine cycle is an INSTRUCTION FETCH, the coding on data lines $D_0$–$D_7$ as latched into the status latch will be 01000101. The binary code on each of the data terminals during the initial part of the cycle indicates a condition, as set forth in the status information column. In accordance with Intel 8080 terminology, the logic of data bus $D_0$ is the interrupt acknowledge (INTA). This logic indicates whether an interrupt request has been acknowledged and can be used to gate a restart instruction onto the data buses when the DBIN or DBINP line is active. The logic on the $D_1$ line during the initial part of the machine cycle indicates whether or not there is a writing function. This status is labeled $\overline{W}$ and is a logic 0 when the machine cycle will write data into memory or into an output location. When a logic 1 appears on the $D_1$ instruction line and is latched at the status latch, a memory or input location is read. A logic 1 on the $D_2$ line during the instruction read portion of the cycle indicates that the address buses $A_0$–$A_{15}$ hold the push down stack address from the stack pointer of the microprocessor. This status labeled STACK, is active during only a STACK READ or a STACK WRITE machine cycle.

When a logic 1 appears upon the $D_3$ data line during the initial micro cycle of a machine cycle, this indicates that HALT has been acknowledged. As can be seen in FIG. 2, this occurs during a Halt Acknowledge machine cycle or an Interrupt Acknowledge While Halt machine cycle. Otherwise, during the initial micro cycle, which is labeled $T_1$ in FIG. 3, this data bus $D_3$ is a logic 0. During an output function, the logic on line $D_4$ is a logic 1. This occurs when the machine cycle is an Output Write cycle. A logic 1 on the $D_4$ data line indicates that the address buses contain the address of an output device and that the data bus will ultimately, during the cycle, contain the output data when the $R/\overline{W}$ line is at a logic 0. The logic on data line $D_5$ provides a signal to indicate that the microprocessor is in the FETCH cycle for the first byte of an instruction. Thus, a logic 1 on $D_5$ during the initial portion of the machine cycle indicates that an instruction is to be obtained from memory or another location. This is the status $M_1$ illustrated in FIG. 2. The status INP is contained upon data line $D_6$. A logic 1 on this line during the status portion of a machine cycle indicates that the address buses contain the address of an input device and the input data should be placed upon the data buses when the DBIN output of the microprocessor is active. This output of course corresponds to the DBINP line of the CPU module 10. MEMR logic appears upon the $D_7$ data bus. A logic 1 on this bus during the status information portion of the cycle designates that the data buses will be used for a memory read operation.

During the status portion of any cycle, the coding upon data lines $D_0$–$D_7$ are the codes indicated in FIG. 2. This coding is an inherent function of the 8080 microprocessor and is set forth only for the purpose of a more convenient arrangement for understanding the preferred embodiment of the present invention.

BASIC INSTRUCTION CYCLE FOR CPU MODULE

The microprocessor employed in the preferred embodiment of the present invention has a basic instruction cycle as illustrated in FIG. 3. The microprocessor is timed by the input pulses $\phi 1$, $\phi 2$, the first of which determines the initial portion of a micro cycle labeled $T_1$–$T_5$. The micro cycle $T_W$ is set forth for the purpose of designating a wait condition which was described earlier with respect to the interplay between the READY logic and the WAIT logic. If a memory is not ready, then the microprocessor goes into a WAIT state represented by a logic 1 on the WAIT line, i.e. a logic 0 on the $\overline{WAIT}$ line. When the memory is then ready, the WAIT line shifts back to a logic 0 and the microprocessor continues into micro cycle $T_3$. For each machine cycle there is a synchronizing pulse labeled SYNC. This synchronization pulse corresponds essentially to the internal synchronizing pulse of the 8080 microprocessor. The pulse has been shaped somewhat. The pulses shown in FIG. 3 are those entering and leaving the module 10; however, they are basically the pulses from the microprocessor itself. During each of the micro cycles, the function set forth at the lower portion of FIGURE 3 takes place. Sometime three micro cycles are used. In other instances, many micro cycles are required for a particular instruction. For instance, in an Intel 8080 when memory is accessed, as many as eighteen micro cycles may be used in normal operation. During the $T_1$ micro cycle of a machine cycle, the logic on lines $D_0$–$D_7$ is read. The address on lines $A_0$–$A_{15}$ (at the address terminals of microprocessor MP) is provided by either the internal program counter or another register within the microprocessor. This address information is placed into the program counter or register during a prior machine cycle. The DBINP line corresponds to the internal DBIN line. This determines whether or not data is placed on the data lines $D_0$–$D_7$, in a subsequent portion or micro cycle of the machine cycle. During the initial portion, the data at the data terminals of the microprocessor indicates the type of cycle to be processed during the machine cycle which may require several micro cycles. The logic on the lines designated in FIG. 3 changes according to the type of instruction to be processed in accordance with well known practice in the microprocessing art. These logic conditions will be employed throughout the description of the preferred embodiment of the present invention.

PREFERRED EMBODIMENT

Figure 6A:
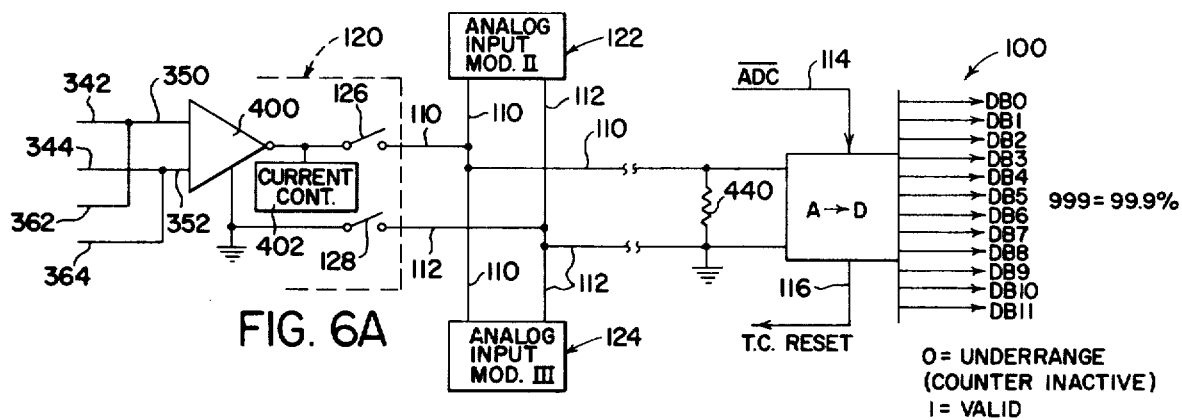
FIGS. 6A, 6B and 6C are taken together to describe an analog to digital conversion circuit of the type contemplated for use in the preferred embodiment of the invention as illustrated in FIG. 4.
Figure 6B:
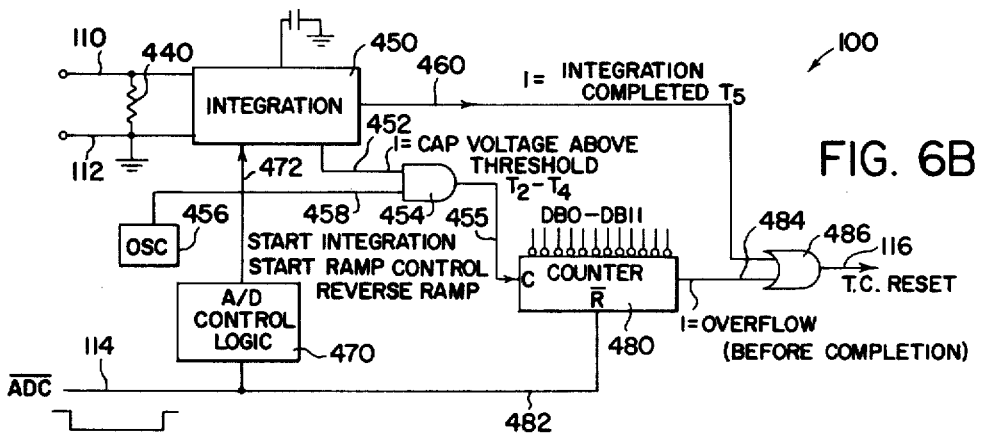
Figure 6C:
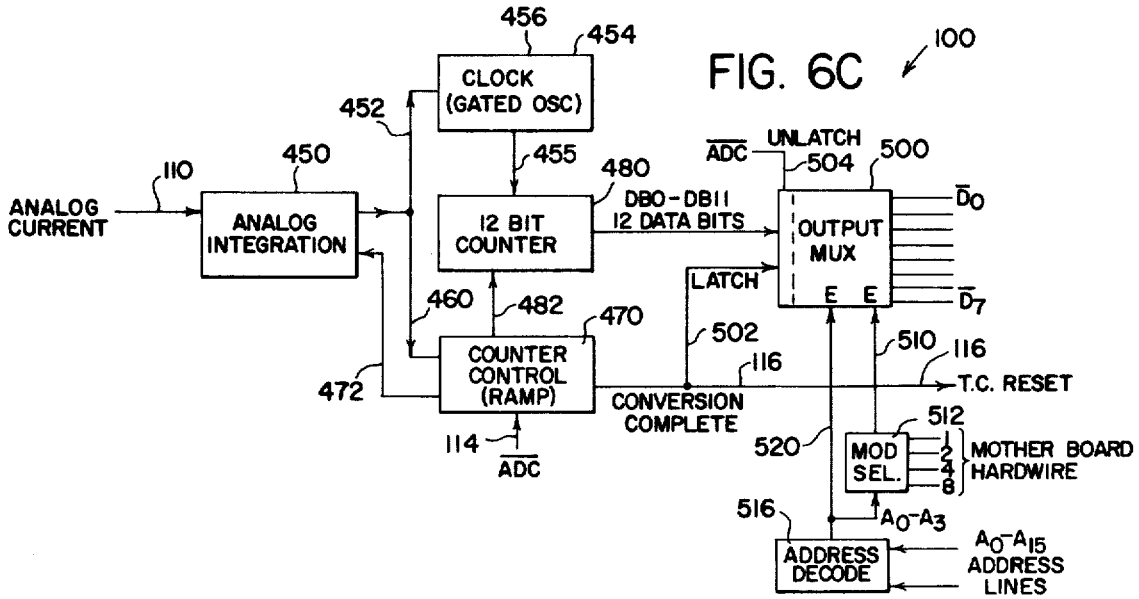

Referring now to FIG. 1, system A includes an analog to digital conversion module or circuit 100, best shown in FIGS. 6A, 6B and 6C. This circuit includes somewhat common concepts in converting an input analog voltage to output digital data. In accordance with the preferred embodiment of the invention, the resulting or converted digital data is multiplexed onto data lines $\overline{D_0}$-$\overline{D_7}$ of system A, in a manner to be described later. An analog signal to be converted is imposed across lines 110, 112. A conversion signal $\overline{ADC}$ is provided in line 114 to start the operation of conversion circuit 100 at the end of this pulse. After the conversion from analog to digital data has been completed by circuit 100, a logic 1 appears in the T.C. RESET line 116. Thus, an analog signal together with a conversion signal in line 114 is directed to circuit 100. Thereafter, a logic 1 completion signal is created in the T.C. RESET line 116. Multiplexing module 120 is provided in system A, as shown in FIG. 1. Several of these modules could be used to multiplex a large number of analog input signals to circuit 100. In the illustrated embodiment, module 120 as indicated to be the input module I, which will be explained in detail in FIG. 4. This module is illustrated schematically in FIG. 6A with analog input modules 122 and 124. Of course, several modules could be used to increase the analog input capabilities. Each of these modules is the same and includes eight separate analog input circuits TC0–TC7. Of course, any analog signal could be connected to one of the input circuits TC0–TC7 without changing the operation of input module 120. The input lines or circuits TC0–TC7 direct analog conditions to module 120, which conditions can be temperature, speed, acceleration, position or any other signal that is analog in nature. Referring now to FIG. 6A, the other input modules 122, 124 are connected in parallel with lines 110, 112 for directing selected analog signals to the conversion circuit 100 by selectively closing switches 126, 128 of a module. As will be indicated in FIG. 4, only the input circuits at TC0 and TC7 are illustrated in detail for the purposes of simplicity. However, in practice, eight separate inputs TC0–TC7 are provided on each analog input module.

In operation, referring again to FIG. 6A, the several analog inputs TC0–TC7 of analog input modules 120, 122 and 124 are connected to various analog signals to be read and converted into digital data for use in system A. By an appropriate address, of the type shown in FIG. 7, one of the modules 120, 122 and 124 is addressed and active. This provides a $\overline{ADC}$ conversion signal in line 114 extending from the actuated modules 120, 122 or 124 to the analog to digital circuit 100. Input module 120 reads and decodes the logic on data lines $D_0$–$D_3$. This decoded information selects one of the analog inputs TC0–TC7 and applies the selected signal across analog signal lines 110, 112. After conversion has been completed, a logic 1 appears in the T.C. RESET line 116, which is communicated to all modules 120, 122 and 124. This resets all of the modules for subsequent selection and operation. In this manner, several input modules can be multiplexed to the conversion circuit 100 for creation of digital data corresponding to a selected input analog condition from the addressed analog input modules.

Referring now to FIG. 4, the preferred embodiment of the analog input modules 120, 122 and 124 is schematically illustrated with only two of analog input circuits TC0 and TC7 being shown. A larger number of input modules could be used and each module, in practice, includes eight separate analog input circuits TC0–TC7. The two circuits TC0 and TC7 are shown for the purpose of describing the operation of module 120 and the addition of other input circuits in parallel is quite apparent.

Figure 7:
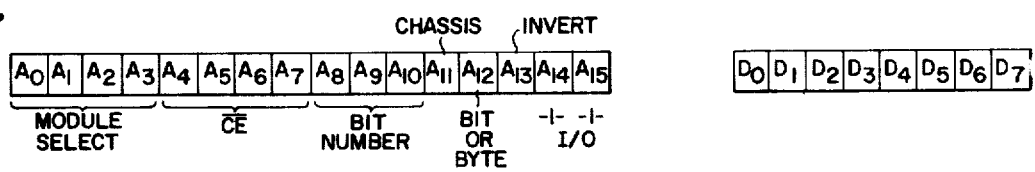
FIG. 7 is a schematic illustration of an address of the type employed in operation of the preferred embodiment as shown in FIG. 4.

Module 120 will be described in connection with a cycle for selecting and directing an analog signal to the conversion circuit 100. This description of the operation of module 120, together with the components used in the preferred embodiment, will clearly illustrate the inventive concepts of the present invention. In FIG. 7, there is illustrated an address used for selecting a given module and the data lines selecting one of circuits TC0–TC7. Address lines $A_0$–$A_{15}$ are used to select the chassis in which modules 120, 122, 124 are located and the particular module during an input/output command from the system A illustrated in FIG. 1. The address of the module is determined by its position in the chassis by the use of hardwired digital data provided at the various chassis locations. This is an input/output i.e. I/O address as distinguished from a memory address used to store data from lines $\overline{D_0}$-$\overline{D_7}$. Address lines $A_8$–$A_{10}$, $A_{12}$, $A_{13}$ relate to the type of operation for processing data which is not involved in the module 120. Data is provided by system A on the data lines $\overline{D_0}$-$\overline{D_7}$ when a WRITE cycle is activated by the WRITE pulse in the WRITE line R/W. A module decoding or addressing circuit 130 is provided at the input side of module 120. The address on lines $A_4$–$A_7$ and $A_{11}$, $A_{14}$, $A_{15}$ provides a logic 0 in $\overline{CE}$ line 132 when the chassis into which module 120 is located is to be activated. The logic on address lines $A_0$–$A_3$ is compared with hardwired logic in the motherboard at the mounting location of module 120 to provide a comparison at address circuit 130. Assuming that the addressing is proper, a logic 1 appears in the output line 134 from addressing circuit 130. This activates module 120. A WRITE gate 140 in a NAND gate having a first input 142 connected by inverter 144 to the DBINP line. The second input 146 of gate 140 is the output of inverter 148 connected to the R/$\overline{W}$ line. A pulse in this line produces a WRITE signal to module 120. Assuming that module 120 has been addressed and the CPU of system A has been commanded to process a WRITE to output command, the DBINP line is at a logic 0. Ultimately, the WRITE line R/$\overline{W}$ shifts to a WRITE signal, i.e. logic 0, at the input of inverter 148. At this time, all input lines to gate 140 are at a logic 1; therefore, output 150 of this gate is shifted to the WRITE mode, i.e. a logic 0. The WRITE pulse, as shown in FIG. 3 is generally 500 ns in length. Thus, a 500 ns logic 0 WRITE pulse is created in line 150. An inverter 152 connects line 150 with line 154 at the clocking terminal 2A of one shot device 160. This device has a known time delay of 2.3 ms, as indicated by the biasing circuits. A positive transition in line 154 causes a positive pulse in the Q terminal at line 162 of one shot device 160. This applies a logic 1 pulse for 2.3 ms at one input of NAND gate 164, the output of which is $\overline{ADC}$ line 114. As so far described, there is no select signal in the line 170; therefore, the output of gate 164 is at a logic 1 and has not been toggled to actuate circuit 100.

The WRITE line 150 also controls gate 180. A logic 0 at this input of gate 180, which is a NAND gate, produces a logic 1 in output line 182. This logic 1 is inverted by inverter 184 to produce a logic 0 condition in line 186, which is connected to the negative clocking terminal 1A of a one shot 190. This one shot device has a negative pulse of 100 ns at the $\overline{Q}$ output terminal connected to line 192. Thus, when there is a WRITE signal in line 150, a 100 ns negative pulse appears in line 192 which is directed to a NAND gate 200 having a RESET input. The system RESET line is at a logic 1 during operation of system A. Thus, a logic 0 pulse in line 192 causes a logic 1 pulse of 100 ns in output 202 of gate 200. Inverter 204 inverts this logic to produce a logic 0 pulse in the CLEAR line 206 connected to the CLEAR terminal $\overline{CL}$ of a standard eight bit addressable latch decoder 210. This decoder is cleared to produce all zeros at output terminals 0–7 during a CLEAR pulse in line 206. The logic on data line $D_3$ controls decoder 210. A logic 0 at terminal D prevents a select logic on any terminal 0–7. The E terminal of latch decoder 210 latches a logic 1 in one of the output terminals 0–7, in accordance with the binary logic on input lines $D_0$, $D_1$ and $D_2$ connected to the input terminals a, b and c of latch decoder 120. This assumes that the logic on line $D_3$ is a logic 0. When there is a WRITE pulse of approximately 500 ns in line 150, latch decoder 210 is latched to decode the logic on lines $D_0$–$D_2$; however, the CLEAR terminal $\overline{CL}$ overrides the latch terminal E for the 100 ns CLEAR pulse in line 206. This concept is shown in FIGS. 8 and 9. Consequently, when an address as shown in FIG. 7 appears and the CPU creates a WRITE signal, latch decoder 210 is first cleared. During this same WRITE signal, a logic 1 signal is latched into one of the output terminals 0–7 of decoder 210. The selected terminal is determined by a one of eight decoding of the logic on lines $\overline{D_0}$-$\overline{D_2}$. This latching of one terminal actuates one of the input circuits TC0, TC7. In this illustrated embodiment, only input circuits TC0 and TC7 are illustrated. Thus, only terminals 0 and 7 are illustrated at the output of decoder 210. Select line 220 is connected to output terminal 0 and line 222 is connected to output terminal 7. Inverters 224, 226 invert the logic in lines 220, 222, respectively, to produce the opposite logic in lines 230, 232, respectively. These latter lines, eight of which are used in the preferred embodiment, are connected to the input of a select NAND gate 240. The logic on the data line $D_3$, during module addressing, controls the overall operation of the latch decoder 210. If $D_3$ is a logic 0, $\overline{D_3}$, which is the data line of system A at terminal D of latch decoder 210, is at a logic 1. This enables gate 210 to store a logic 1 to one of its outputs. Throughout this discussion of the preferred embodiment of module 120, it is assumed that decoder 210 is enabled by a logic 1 at the D terminal.

If one of the circuits at the output of latch decoder 210 on module 120 is to be deactivated, the logic on lines $\overline{D_3}$ is set to logic 0 to produce a logic 0 at the selected output of decoder 210. A logic 0 on all output terminals of latch decoder 210 produces a logic 1 at all inputs of select gate 240 and a logic 0 in a select line 170. This logic 0 is created during the CLEAR cycle of decoder 210 also. If one of the output terminals 0–7 has been selected during a WRITE command by the decoded logic of lines $\overline{D_0}$–$\overline{D_2}$, the select line 170 shifts to a logic 1. This logic combines with the logic on line 162 to produce a negative pulse in the $\overline{ADC}$ line 114. This eventually causes conversion circuit 100 to be actuated for converting the analog signal between lines 110, 112 into a digital output code, in a manner to be described later.

Select line 170 also controls inverter 250 to produce a logic 0 in line 252 when there has been a selection by decoder 210. This logic 0 maintains a logic 1 in line 182 even through the WRITE pulse in line 150 ultimately disappears during the processing cycle. Thus, during a single WRITE command, one shot device 190 is not clocked again at a negative terminal 1A controlled by line 186.

When line 170 shifts to a select logic 1 condition during a WRITE address, this logic 1 enables both transistor switches 126, 128 in switching circuit 260. Thus, switches 126, 128 of module 120 are closed to connect the selected analog condition from module 120 to the input of the conversion circuit 100. To obtain the analog signal for use across lines 110, 112, there are provided relay control networks 300, 302. Network 300 controls the circuit input switches $CR0_a$, $CR0_b$, $CR7_a$ and $CR7_b$. Network 302 controls output switches $CR10_a$, $CR10_b$, $CR17_a$, and $CR17_b$. The transfer of analog data to lines 110, 112 from a selected one of the circuits TC0, TC7 is determined by operation of the relay control networks. In the illustrated embodiment, only two input circuits are shown. Thus, each of the circuits 300, 302 includes only two relay control circuits. However, in practice, eight separate input circuits are used, and each of the networks 300, 302 includes eight separate relay circuits. Referring now to the network 300, this network is used to open a selected set of input switches $CR0_a$, $CR0_b$, $CR7_a$ and $CR7_b$, on the input circuits TC0, TC7. Relay circuit 310, when energized, opens relay controlled switches $CR0_a$, $CR0_b$ in input circuit TC0. Relay circuit 312, when energized, opens contacts $CR7_a$, $CR7_b$. Thus, when a given analog input circuit TC0, TC7 is selected by latch decoder 210, a logic 0 appears at the input side of one of the inverters 314, 316. This produces a logic 1 at the output of the inverter and at the input of one of the circuits 310, 312, respectively. Circuits 310, 312 are connected to the +12 volt line 318. Thus, for the selected circuit TC0 or TC7 a logic 1 turns off one of the relay circuits 310, 312. Since the switches of the relay circuits are held closed by a logic 0 or no select condition at inverters 314, 316, the input switches controlled by the deactivated relay circuit opens. In the light relay circuits used in practice and graphically indicated in FIG. 4, only one relay circuit of network 300 will be deactivated. The remaining will stay activated to hold the input contacts of the non-selected circuit TC0–TC7 in the closed condition.

Relay circuits 320, 322 of network 302 energize the selected relay circuit, instead of deactivating the selected relay circuit. Inverters 324, 326, invert the logic on lines 320, 322, respectively. Thus, the analog conditions selected by latch decoder 210 produce a logic 0 at the output of one of the inverters 324, 326. This logic 0 activates the selected relay circuits 320, 322 to cause closing of the output switches $CR10_a$, $CR10_b$ or the output switches $CR17_a$, $CR17_b$. Capacitors 340 of circuits TC0, TC7 are charged to the voltage determined by thermocouple or other transducer controlling circuits TC0, TC7. When one of the analog conditions is selected, the input switches are opened by de-energizing one of the relay circuits 310, 312. In a like manner, the output switches of the selected circuit are closed by energizing a corresponding one of the relay circuits 320, 322.

The voltage stored in capacitor 340 of input circuit TC0 is selectively applied to lines 342, 344 when switches $CR10_a$, $CR10_b$ are closed. Output lines 342, 344 are connected in parallel across lines 350, 352 which are the input of the signal creating circuit SC of module 120. Output switches $CR17_a$, $CR17_b$ apply the voltage stored across capacitor 360 of input circuit TC7 to lines 362, 364. These lines are connected to signal creating circuit SC by lines 350, 352. The other six circuits are also connected across lines 350, 352 when selected by decoder 210.

The signal creating circuit can take any form to produce an analog signal of a fixed voltage across circuit 100 during comparison. In practice the fixed analog signal is produced by a constant current signal proportional to the stored voltage on one of the capacitors 340, 360. In the illustrated embodiment, signal creating circuit SC includes differential amplifier 400 which creates a constant output in line 401 proportional to the input voltage of capacitor 340 or capacitor 360. This output line controls the base voltage of transistor Q2 which is coupled with a current controlling circuit 402 and a voltage limiting circuit 404 so that a proportional current is created in the output line 406. This current is proportional to the input analog voltage. Many circuits could be provided for converting an input voltage to an accurately controlled constant output current. This concept is used in accordance with the present invention so that the resistance or impedance at the output side of module 120 and the input side of conversion circuit 100, together with the interconnecting resistance, will have negligible effect on the signal being received from module 120 by module or circuit 100. The current generating circuit SC, shown in phantom lines in FIG. 4, has the parameters indicated by the various components. These parameters are representative in nature to show a system for creating a constant current proportional to input voltage across lines 350, 352. Of course, any number of current signal creating circuits could be used for this purpose. As shown schematically in FIG. 6A, the input voltage across lines 350, 352 is controlled by differential amplifier 400 and a current control arrangement 402 to produce a selected constant current flow through switches 126, 128 of the selected input analog module 120. Closing the output switches $CR10_a$, $CR10_b$ and $CR17_a$, $CR17_b$ of the selected one of circuits TC0, TC7 is delayed by 1.5 ms through a one shot device 410. In this manner, it is assured that the input swithes are opened before the output switches $CR10_a$, $CR10_b$ or $CR17_a$, $CR17_b$ are closed by energizing one of the circuits 320, 322. A variety of arrangements could be used for actuation delay. In the illustrated embodiment, the one shot device 410 is energized by the negative transition in line 186 at the output of inverter 184. Thus, as soon as there is a WRITE signal, a logic 1 appears at the Q terminal of one shot device 410. This reduces the base voltage on transistor Q1 to prevent the application of the +12 volt power supply to line 328 at the output side of circuits 320, 322. After the time delay logic 1 pulse at the Q terminal, a full +12 volts is applied to line 328. This allows actuation of circuits 320, 322 to close the output switches of the selected analog input circuit CR0-CR7. Circuits 310, 312 are directly connected to a +12 volt power supply through line 318. Consequently, circuits 310, 312 are operated as soon as a selection has been made by decoder 210. Circuits 320, 322 are delayed for a known period of time to prevent connection of circuit SC with a measuring voltage source which could produce excessive currents or variable voltages.

The operation of the embodiment of the invention shown in FIG. 4 is set forth in FIG. 5 wherein certain pulse forms are shown. As can be seen, the representative input switches CR7 are opened as soon as a select signal has been created by a one shot device 190. After a time delay controlled by one shot 410, the output switches CR17 are then closed. One shot 190 controls the clear pulse for a time less than the operation of gate 140. One shot 160 controls the end of the compare signal $\overline{ADC}$ which starts the comparing function in circuit 100.

Referring now to FIGS. 6A, 6B and 6C, one type of analog to digital conversion circuit is illustrated. In this circuit, taking the three figures together, there is provided an analog input resistor 400 which creates a voltage proportional to the constant current supplied across switches 126, 128 of the activated module 120, 122 or 124. Integration circuit 450 having the characteristics shown in the integration voltage chart of FIG. 5, accepts the constant voltage across resistor 440 to control the ramp of the integrating circuit for a fixed period of time. Referring now to the integration voltage shown in FIG. 5, between times $T_1$ and $T_2$ the integration circuit (capacitor) charges at a fixed rate determined internally of integration circuit 450. At time $T_2$, the integration voltage curve has reached the capacitor threshold voltage which will cause a logic 1 in line 452 for a purpose to be described later. Thereafter, the voltage increases in the integrator at a rate determined by the voltage across resistor 440. After a fixed time, $T_3$, the counter is reset and the ramp control hangers state to cause discharge of voltage (capacitor) from point M to a lower reference level at time $T_5$. This discharge is at a fixed rate controlled by a constant reference voltage. This fixed rate causes the voltage to reach the threshold voltage at time $T_4$. The spacing between time $T_2$ and $T_4$ is indicative of the magnitude of the voltage across resistor 440. By operating a fixed frequency controlled counter for the time between $T_2$ and $T_4$, the counter will count to a number proportional to the voltage across resistor 440. After reaching time $T_4$, line 452 shifts to a logic 0 for a purpose to be described later. Line 452 controls one input of AND gate 454. The other input is a fixed frequency oscillator or clock 456 connected to a line 458. Thus, as soon as time $T_2$ is reached, gate 454 is active to create fixed frequency counting pulses in line 455. Between time $T_4$ and time $T_5$, a logic 1 appears in line 460. The A/D control logic 470 is used to shift the direction of voltage in integration circuit 450 after a fixed time $T_3$. A ramp control pulse is created by control 470 and starts at the end of the $\overline{ADC}$ pulse, as shown in FIG. 5. Thus, the control logic 470 is controlled by the positive going portion of the $\overline{ADC}$ comparison signal. Control line 472 directs the ramp control logic to integration circuit 450 in a time relationship shown in FIG. 5. In accordance with somewhat common practice, clock line 455 causes counting of a counter 480 having a reset line 482. During the $\overline{ADC}$ pulse, counter 480 is reset and can not count. Thereafter, pulses from oscillator 456 passing through gate 454 are directed to counter 480 by line 455. The counter is a 12 bit counter having output terminals DB0-DB11. An over scale line 484 can be provided by counter 480 so that if the scale to be read from terminals DB0-DB11 has been exceeded, a logic 1 appears in this line. This will cause a logic 1 in the T.C. RESET line 116, irrespective of the completion of integration which is signalled by the logic on line 460. A logic 1 at the completion of integration or at an overflow condition causes a logic 1 in T.C. RESET line 116.

Referring now more particularly to the output side of circuit shown in FIG. 6A, the logic on terminals DB0-DB11 indicates the percentage of maximum scale which has been recorded by the conversion circuit 100. At least ten terminals are required to provide a 100% of scale. The eleventh terminal can indicate over scale and control the logic on line 484. Another line, indicated as $DB_{11}$, can indicate under range which would occur when no voltage is applied across resistor 440. This can occur when there is an open circuit at the input of an analog input circuit CR0–CR7. When this happens, a logic on a line, such as DB11, can be read. Of course, other arrangements could be provided for indicating the status of circuit 100 on certain output terminals such as DB0-DB11. It is only necessary that an appropriate digital code be provided indicating the magnitude of the voltage across resistor 440.

The number of output terminals DB0-DB11 used by circuit 100 exceeds the available data lines $\overline{D_0}$-$\overline{D_7}$ in system A. For that reason, the output multiplexing circuit 500, shown in FIG. 6C, is provided for using all digital data from the DB0-DB11 terminals. A logic 1 in line 116 which indicates that conversion has been completed, activates the latch line 502 to latch the data on terminals DB0–DB11 into multiplexing circuit 500. Thereafter, the multiplexing circuit is enabled by a line 510 controlled by motherboard hardwired addressing at the input to a module select circuit 512, similar to select circuit 130 of FIG. 4. The address on lines $A_0$-$A_{15}$ is directed to address decoder 516 which passes through the data on lines $A_0$-$A_3$ to control module select circuit 512. The condition of these address lines is compared with the hardwired code on lines 1, 2, 4 and 8. In addition, decoded information from address lines $A_0$-$A_{15}$ is passed through line 520 to enable multiplex 550 to select eight bit information from selected terminals DB0-DB11. This data is applied across the $\overline{D_0}$-$\overline{D_7}$ bi-directional data lines. A second address then selects the data from remaining terminals DB0-DB11. In practice, the first address selects DB0-DB7 for application on the bi-directional data line D0-D7. Thereafter, a second address selects the next group of outputs DB8-DB11. Thus, in a series of two steps, the total data from the conversion circuit can be multiplexed onto the bi-directional data lines $\overline{D_0}$-$\overline{D_7}$. By providing two bytes of information from multiplexing circuit 500, the total range of the data information can be provided for use in system A. This use can be employed to change heating elements, change speed, or change other functions which are monitored by measuring the voltage across resistor 440. The circuitry shown in FIGS. 6A, 6B and 6C are taken together to show the general operation and element composition of a conversion circuit 100, which can be employed by the module 120 shown in FIG. 4. Of course, modifications of this conversion circuit and its multiplexing could be incorporated, as long as the conversion system accepts analog data in current form, converts this data into digital form at a conversion pulse, provides this data on output terminals after conversion has taken place, and then provides a conversion completion signal for use in deselecting module 120.

Referring again to module 120, upon receipt of a completion pulse in the T.C. RESET line 116, inverter 550 produces a logic 0 pulse in line 551. This logic 0 pulse is a deselect pulse which actuates one shot device 410. Thus, on de-selection by the T.C. RESET line, the voltage of line 328 is reduced. This deactivates the activated one of circuits 320, 322. Immediately the closed switches $CR10_a$, $CR10_b$, or switches $CR17_a$, $CR17_b$ are opened. The deselecting pulse in line 551 also operates one shot circuit 552, biased as indicated, to produce a 1.5 ms pulse similar to the pulse created at the output of one shot device 410. This pulse appears at the $\overline{Q}$ output and is a logic 0. Thus, as soon as this pulse disappears, i.e. after 1.5 ms, the positive terminal 1B of one shot circuit 190 is clocked. This again creates a 100 ns output pulse in line 192 to clear the addressable latch decoder 210 by a logic 0 CLEAR pulse in line 206. Thus, the deactivated one of relay circuits 310, 312 is activated by the 12 volt power supply at line 318. This then closes input relay switches $CR0_a$, $CR0_b$ or input relay switches $CR7_a$, $CR7_b$, according to which of these switches had been opened during an input select operation. Thus, no voltage is applied across lines 350, 352 of module 120. In addition, lines 230, 232 are now at a logic 1. This produces a logic 0 in the select line 170. Switches 126, 128 are opened. Gate 164 is disabled and gate 180 is unlatched by a logic 1 in line 252 for receiving a subsequent WRITE pulse in line 150. After deselection, any of the modules 120, 122 and 124 can be selected for inputting another analog condition through the module and to the conversion circuit 100. Only one conversion circuit need be used for all the modules. Although three modules have been used for inputting analog information in the illustrated embodiment, in practice, sixteen modules can be decoded by the information on address lines $A_0$-$A_3$.

The module, together with conversion circuit 100, is a hardwired self stopping component for use in system A. After a selection has been requested, module 120 and circuit 100 perform their functions and then wait. The decoded information remains in the latched lines DB0-DB11 for reading by subsequent cycles until unlatched by a new WRITE cycle address to an input module together with a circuit select code on lines $D_0$-$D_3$.

For the purpose of biasing one shot devices 160, 410 and 552, a constant 5 volt power supply circuit 560 is provided to fix a logic 1 or +5 volt condition in control line 562. In the illustrated embodiment, +5 volt control is used for the logic and the +12 volt power supply is used for operating the relay control circuits 310, 312, 320 and 322.

As indicated during the description of the preferred embodiment, various modifications may be made in the circuitry employed to produce the various parameters and conditions employed in the operation of the module 120 constructed in accordance with the present invention.

In accordance with the illustrated embodiment of the present invention, the system employs automatic communication between the analog to digital conversion circuits and the analog input circuits by lines ADC and T.C. RESET to reduce the number of programmed commands necessary to obtain a digital representation, at terminals, DB0-DB11, of the analog input signal.

Also, the system employs automatic communication between the analog to digital conversion circuits and the analog input circuit T.C. RESET, to automatically return the selected analog input to the deselected state independent of programmed commands, thereby increasing the number of times a given input may be accessed while maintaining a desired conversion accuracy.

Having thus defined the invention, it is claimed:

1. A module for use in a programmable controller having a control processing unit with output address lines, a selected number of input/output bi-directional data lines, means for creating a write signal in a write line and means responsive to said write signal for writing data from said data lines into selected addressed locations, said module comprising: means for receiving at least two analog voltage signals; a signal converting circuit for converting an analog voltage signal at a circuit input to an output analog signal at a circuit output, said output analog signal being capable of conversion into digital data by an external analog to digital conversion circuit; means for selectively activating said module by a given coded address in said address lines of said central processing unit; a signal selecting means for selecting one of said analog voltage signals in response to the simultaneous appearance of a write signal in said write line, said given address in said address lines and a signal selecting code in said data lines, said signal selecting code corresponding to the particular analog voltage signal to be selected; means for applying only said selected analog voltage signal to said circuit input of said signal converting circuit; means for creating a select signal only when one of said analog voltages has been selected; said module having output lines directed to said external conversion circuit and a single switching means for connecting said circuit output of said signal converting circuit to said output lines when said switching means is in a first condition and for electrically isolating said output lines of said module from said circuit output of said signal converting circuit on said module when said switching means is in a second condition; means for shifting said switching means into the first condition only when said select signal is in existence and means for shifting said switching means into the second condition when said select signal is not present.

2. A system for providing a digital data representative of a selected analog signal on the data lines of a programmable controller using a central processing unit employing a microprocessor having output address lines, a selected number of input/output bi-directional data lines, means for creating a write signal in a write line and means responsive to said write signal for writing data from said data lines into selected addressed locations, said system comprising: a separate conversion module having a conversion circuit for converting an input analog signal to digital data on output data terminals upon receipt by said circuit of a conversion signal on a first input line of said conversion module simultaneously with selected analog signal across second and third input lines of said conversion module and means on said conversion module for creating a completion signal on an output line of said conversion module when said conversion is completed by said conversion circuit; and at least two separate analog input modules, each of said input modules including means for receiving at least two analog voltage signals, decoder means for selecting one of said analog voltage signals, means for shifting said decoder means into a cleared condition selecting no analog voltage signal, and signal converting means for converting said selected one of said analog voltage signals to an input analog signal for conversion by said conversion circuit; decoding means on each of said input modules for actuating only one of said input modules by a coded actuation signal directed to both of said input modules; module isolating means on each of said input modules, said isolating means having a first condition applying the input analog signal from said signal converting means and corresponding to said selected analog voltage signal across said second and third input lines of said conversion module and a second condition electrically isolating said input module from said second and third input lines; means responsive to said actuation signal for shifting said isolating means of the actuated one of said input modules to said first condition; and means on each of said input modules and responsive to said conversion completion signal on said output line of said conversion module for shifting an isolating means in said first condition on either of said input modules to said second condition.

3. A system for providing digital data representative of a selected analog signal on the data lines of a programmable controller using a central processing unit having output address lines, a selected number of input/output bi-directional data lines, means for creating a write signal in a write line and means responsive to said write signal for writing data from said data lines into selected addressed locations, said system comprising: a separate conversion module having a conversion circuit for converting an input analog signal to digital data on output data terminals upon receipt by said conversion circuit of a conversion signal simultaneously with a selected analog signal and means on said conversion module for creating a completion signal when said analog to digital conversion is completed; and a separate analog input module including means for receiving at least two analog voltage signals; means for converting a selected one of said analog voltage signals to an analog current signal; selecting means for selecting said one analog voltage signal upon creation of said write signal; switching means on said input module for directing an analog current signal from said signal converting means to said conversion circuit upon being actuated, said signal selecting means including a data latch means with input terminals for receiving a select logic code, output terminals, means for clearing said data latch means to an inoperative state on said output terminals upon creation of a clear signal; means on said data latch for latching a decoded enabling signal corresponding to said logic code at one of said output terminals upon creation of a latching signal; and, said selecting means also including means for selecting one of said analog voltage signals in response to an enabling signal in a given one of said output terminals; means for actuating said switching means in response to the existence of an enabling signal on any of said output terminals of data latch means on said input module; means on said input module for creating a conversion signal in response to the existence of one enabling signal on any of said output terminals; means responsive to a single write signal for creating a clear signal and then said latching signal, said clear signal having a duration substantially less than said latching signal; and, means for removing the enabling signal from any of said output terminals in response to creation of said completion signal at said conversion module.

4. A system for providing a digital data representative of a selected analog signal on the data lines of a programmable controller using a central processing unit employing a microprocessor having output address lines, a selected number of input/output bi-directional data lines, means for creating a write signal in a write line and means responsive to said write signal for writing data from said data lines into selected addressed locations, said system comprising: a separate conversion module having a conversion circuit for converting an input analog signal to digital data on output data terminals upon receipt by said circuit of a conversion signal on a first input line of said conversion module simultaneously with selected analog signal across second and third input lines of said conversion module and means on said conversion module for creating a completion signal on an output line of said conversion module when said conversion is completed by said conversion circuit; and at least two separate analog input modules, each of said input modules including means for receiving at least two analog voltage signals, decoder means for selecting one of said analog voltage signals, means for shifting said decoder means into a cleared condition selecting no analog voltage signal, and signal converting means for converting said selected one of said analog voltage signals to an input analog signal for conversion by said conversion circuit; decoding means on each of said input modules for actuating only one of said input modules by a coded actuation signal directed to both of said input modules; switching means on each of said input modules, said switching means having a first condition applying the input analog signal from said signal converting means and corresponding to said selected analog voltage signal across said second and third input lines of said conversion module and a second condition electrically isolating said input module from said second and third input lines; means responsive to said actuation signal for shifting said switching means of the actuated one of said input modules to said first condition; means on each of said input modules and responsive to said conversion completion signal on said output line of said conversion module for shifting a switching means in said first condition on either of said input modules to said second condition; and means on each of said input modules and operative after said conversion completion signal on said output line for shifting said decoder means of each input module to said cleared condition.

* * * * *

UNITED STATES PATENT AND TRADEMARK OFFICE
CERTIFICATE OF CORRECTION

PATENT NO. : 4,188,617  Page 1 of 2
DATED : February 12, 1980
INVENTOR(S) : Jess F. Fauchier, William H. Seipp, Stephen E. Whiteside It is certified that error appears in the above-identified patent and that said Letters Patent are hereby corrected as shown below:

In the drawings, Sheet 2, Fig. 3, the reference designation $A_{16}$ in the listing under STATUS INFORMATION should read -- $A_{15}$ --; Sheet 5, Fig. 6C, the reference designation $\overline{D}_0$ and $\overline{D}_7$ should read -- $D_0$ and $D_7$, respectively. Column 2, line 24, after "by" insert -- a --. Column 5, line 15, after "microprocessor" delete the comma (,). Column 8, line 17, "R/W" should read -- R/$\overline{W}$ --. Column 10, line 1, "∅2" should read -- ∅2 --; line 55, "HOLD REQUEST" should read -- $\overline{\text{HOLD REQUEST}}$ --; line 68, "of" should read -- and --. Column 11, lines 1-2, "HOLD REQUEST" should read -- $\overline{\text{HOLD REQUEST}}$ --; line 10, "R/W" should read -- R/$\overline{W}$ --; lines 23-24, "RESET REQUEST" should read -- $\overline{\text{RESET REQUEST}}$ --. Column 12, line 62, "outputs" should read -- output --. Column 14, line 38, "Sometime" should read -- Sometimes --. Column 15, line 4, "$\overline{D}_0$-$\overline{D}_7$" should read -- $D_0$-$D_7$ --. Column 16, lines 19 and 23, "$\overline{D}_0$-$\overline{D}_7$" should read -- $D_0$-$D_7$ --; line 24, "R/W" should read -- R/$\overline{W}$ --; line 36, after reference numeral 142 insert -- is --; line 65, after "shot" (first occurrence) insert -- device --. Column 17, line 12, "E" should read -- $\overline{E}$ --; line 16, reference numeral 120

UNITED STATES PATENT AND TRADEMARK OFFICE
CERTIFICATE OF CORRECTION

PATENT NO. : 4,188,617         Page 2 of 2

DATED : February 12, 1980

INVENTOR(S) : Jess F. Fauchier, William H. Seipp, Stephen E. Whiteside

It is certified that error appears in the above-identified patent and that said Letters Patent are hereby corrected as shown below:

should read -- 210 --; lines 28 and 57, "$\overline{D_0}$-$\overline{D_2}$" should read -- $D_0$-$D_7$ --. Column 18, line 52, after "340" insert -- ,360 --. Column 19, line 41, "swithes" should read -- switches --. Column 20, line 9, reference numeral 400 should read -- 440 --; line 25, "hangers" should read -- changes --. Column 21, lines 15, 33 and 41, "$\overline{D_0}$-$\overline{D_7}$" should read -- $D_0$-$D_7$ --; line 31, reference numeral 550 should read -- 500 --. Column 22, line 65, "control" should read -- central --. Column 23, line 46, "signal" should read -- signals --. Column 24, line 44, after "of" (second occurrence) insert -- said --; line 68, "signal" should read -- signals --.

Signed and Sealed this

Tenth Day of March 1981

[SEAL]

Attest:

Attesting Officer

RENE D. TEGTMEYER

Acting Commissioner of Patents and Trademarks